(12) United States Patent
Klibanov et al.

(10) Patent No.: US 7,498,181 B2
(45) Date of Patent: Mar. 3, 2009

(54) METHOD OF PREPARING AN INTEGRATED CIRCUIT DIE FOR IMAGING

(75) Inventors: Lev Klibanov, Ottawa (CA); Sherri Lynn Griffin, Ottawa (CA)

(73) Assignee: Chipworks Inc., Ottawa, Ontario (CA)

( * ) Notice: Subject to any disclaimer, the term of this patent is extended or adjusted under 35 U.S.C. 154(b) by 429 days.

(21) Appl. No.: 11/237,966

(22) Filed: Sep. 29, 2005

(65) Prior Publication Data

US 2007/0072314 A1   Mar. 29, 2007

(51) Int. Cl.
G01R 31/26 (2006.01)
(52) U.S. Cl. .............. 438/16; 438/14; 438/15; 438/738; 382/145; 382/147
(58) Field of Classification Search .......... 438/15, 438/689, 691, 690, 16, 14, 738; 382/145, 382/294, 147
See application file for complete search history.

(56) References Cited

U.S. PATENT DOCUMENTS

| | | | |
|---|---|---|---|
| 5,086,477 A * | 2/1992 | Yu et al. ............ | 382/145 |
| 5,191,213 A | 3/1993 | Ahmed et al. | |
| 5,694,481 A | 12/1997 | Lam et al. | |
| 6,236,746 B1 * | 5/2001 | Chamberlain et al. ...... | 382/145 |
| 6,263,098 B1 | 7/2001 | Dukes | |
| 6,288,393 B1 | 9/2001 | Phaneuf et al. | |
| 6,289,116 B1 * | 9/2001 | Chamberlain et al. ...... | 382/141 |
| 6,453,063 B1 | 9/2002 | Phaneuf et al. | |
| 6,791,191 B2 | 9/2004 | Chow et al. ............ | 257/775 |
| 6,813,828 B2 | 11/2004 | Dlugokecki et al. ....... | 29/827 |
| 6,907,583 B2 | 6/2005 | Abt et al. | |
| 2003/0071359 A1 | 4/2003 | Teong ................ | 257/758 |
| 2003/0084409 A1 * | 5/2003 | Abt et al. ............ | 716/1 |
| 2005/0226521 A1 * | 10/2005 | LaChance et al. ........ | 382/254 |
| 2006/0045325 A1 * | 3/2006 | Zavadsky et al. ........ | 382/145 |

FOREIGN PATENT DOCUMENTS

WO   WO 2007036034 A1 *   4/2007

OTHER PUBLICATIONS

International Search Report issued Jan. 19, 2007 on applicant's corresponding International Patent Application Serial No. PCT/CA2006/001590.

\* cited by examiner

*Primary Examiner*—Marcos D. Pizarro
*Assistant Examiner*—Eva Montalvo
(74) *Attorney, Agent, or Firm*—Kent Daniels; Blake, Cassels & Graydon LLP

(57) ABSTRACT

Integrated circuit dies are prepared for imaging by completely etching away all metal from the metal lines without removing barrier layers that underlie the metal lines. The metal vias may also be removed, especially if they are formed from the same metal as the metal lines, as in copper damascene circuits. This provides high contrast images that permits circuit layout extraction software to readily distinguish between metal lines and vias.

12 Claims, 5 Drawing Sheets

METHOD OF PREPARING AN INTEGRATED CIRCUIT DIE FOR IMAGING

CROSS-REFERENCE TO RELATED APPLICATIONS

This is the first application filed for the present invention.

MICROFICHE APPENDIX

Not Applicable.

TECHNICAL FIELD

The invention relates in general to examination and analysis of integrated circuits and, in particular, to methods of preparing an integrated circuit die for imaging to permit a structure and layout of the integrated circuit to be extracted.

BACKGROUND OF THE INVENTION

As is well known in the art, the examination and analysis of integrated circuits requires sophisticated sample preparation techniques and imaging tools. In the past, integrated circuits were generally constructed using aluminum for metal lines in each of the metal layers of the integrated circuit and tungsten for vias interconnecting the metal lines with components formed on a polycrystalline silicon layer. Since aluminum and tungsten can be selectively etched, integrated circuits could be deconstructed using selective etching techniques that permit the vias to be segregated from the metal lines, as will be explained below in more detail with reference to FIG. 1. Furthermore, modern integrated circuits generally require sophisticated imaging equipments such as a scanning electron microscope because components are frequently too small to be visible under an optical microscope. In order to distinguish vias from metal lines, it is therefore necessary to acquire images that show contrast between the vias and the metal lines. Tungsten and aluminum are readily distinguished in scanning electron microscope images.

Consequently, a prior art technique illustrated in FIGS. 1a-1d for preparing an integrated circuit die for imaging is commonly used to acquire tile images of a deconstructed area of interest of an integrated circuit die. FIG. 1a is a schematic cross sectional diagram of two metal layers of an integrated circuit die generally indicated by the reference 10. As is well known in the art, each metal layer is covered by an interlayer dielectric (ILD) 12 of a suitable material well known in the art. A metal layer N+1 is separated from the interlayer dielectric 18 on which it is deposited by a barrier layer 16, also composed of a suitable material well known in the art. The barrier layers 16, 22 prevent the deposited metal layers N+1, N from migrating into the interlayer dielectric 18, 24 onto which they are deposited. A metal line 14 of metal layer N+1 is connected to a metal line 20 of metal layer N by a via 26, which is also formed in a manner well known in the art. The barrier layer 16 that separates via 26 from metal layer N is conductive and provides an electrical connection between the via 26 and the metal line 20.

In order to acquire tile images of the integrated circuit 10, passivation layer 12, and any optional barrier material (FIG. 1a) is first removed using a wet or dry etching process or a chemical and/or mechanical polishing process to expose metal lines 14 of metal layer N+1. The integrated circuit die 10 is then placed on a precision stage of the imaging equipment, a scanning electron microscope for example, and tile images are acquired of the area of interest in a manner well known in the art. After the tile images of metal layer N+1 have been acquired, the metal layer N+1 is removed using, for example, a wet or dry etching process or a chemical and/or mechanical polishing process. The process is controlled to remove the metal layer N+1 while preserving the integrity of the vias 26, as shown in FIG. 1c. Thereafter, an etching solution is selected that will remove the barrier layer 16 as well as the interlayer dielectric 18 while leaving the via 26 intact. The results of that etching step are shown schematically in FIG. 1d. If the etching is carefully controlled, the via 26 remains intact and portions of the barrier layer 16r that are shielded by the via 26 and surround the via 26 remain after etching is complete. Thus metal lines 20 of metal layer N and the via 26 are exposed and tile images of the exposed via 26 and metal layer N are acquired in a manner well known in the art.

This prior art process can be referred to as a "bottom up" process because the vias are imaged in conjunction with the metal lines to which they are connected at their bottom ends. While this prior art technique works well for integrated circuits constructed using aluminum metal lines and tungsten vias due to the different etching characteristics of the two metals, integrated circuits are now being manufactured using copper metal lines and copper vias. This makes the prior art method very difficult to perform and complicates layout extraction, as will be explained below with reference to FIG. 2.

FIG. 2 is a reproduction of an image of a copper damascene integrated circuit prepared using the prior art process described above with reference to FIGS. 1a-1d. The image 30 was acquired using a scanning electron microscope. The integrated circuit die was prepared for imaging using a controlled etching process that removed the metal lines of metal layer N+1 and the interlayer dielectric 18 while leaving, to an extent possible, the vias 26. As can be understood by those skilled in the art, the etching process is difficult to control when the vias and the metal lines are made of the same metal. Consequently, some of the vias 26 are eroded and have an oblong shape in the image. As well, the copper lines 32 and the vias 26 are very similar in shade and it is not consistently clear to which metal line 32 a via 26 is connected. Circuit layout information is therefore difficult to extract and prone to errors.

There therefore exists a need for a method of preparing an integrated circuit die for imaging to permit a structure and layout of the integrated circuit to be extracted, regardless of metals used to construct the integrated circuit.

SUMMARY OF THE INVENTION

It is therefore an object of the invention to provide methods of preparing an integrated circuit die for imaging that permits a structure and layout of the integrated circuit to be reliably extracted.

In accordance with one aspect of the present invention there is provided a method of preparing an integrated circuit die for imaging, comprising: removing interlayer dielectric material from a metal layer of the integrated circuit die to expose the metal layer; and removing all metal from metal lines of the metal layer without removing a barrier layer that underlies each metal line.

In accordance with another aspect of the present invention there is provided a method for extracting circuit information from an integrated circuit die, comprising: removing all material covering a first metal layer of the integrated circuit die; etching away all metal from the first layer to completely expose a barrier layer underlying each metal line in the first metal layer; placing the integrated circuit die on a precision stage and acquiring tile images of an area of interest of the integrated circuit die; repeating the removing, etching and placing for each other metal layer; and removing an interlayer dielectric material covering a polycrystalline silicon layer of the integrated circuit die, placing the integrated circuit die on the precision stage and acquiring tile images of polycrystalline silicon layer.

In accordance with yet another aspect of the present invention there is provided a method of preparing an integrated circuit for imaging for the purpose of extracting circuit information, comprising removing all material including all metal from the metal lines and metal vias of a metal layer of the integrated circuit die, and acquiring tile images of barrier layers exposed after all of the metal has been removed from the metal lines and the metal vias of the metal layer.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The invention provides methods of preparing an integrated circuit die for imaging that is useful for preparing integrated circuit dies constructed using any process in which both the metal lines and vias of the integrated circuit are made of the same metal. The methods are very useful for integrated circuits made using an all-copper or an all-aluminum process. However, the process is equally useful for preparing traditional aluminum/tungsten integrated circuits for imaging. In accordance with the method, after a metal layer of an integrated circuit is exposed, all the metal lines in the metal layer are etched away leaving behind barrier layer material. When images are acquired using a scanning electron microscope, the barrier layer material appears as a first color, typically light grey. If the chip is a copper/copper or aluminum/aluminum construction, etching away the metal lines likewise etches away the vias, leaving a barrier layer that surrounds each via. When imaged, etched away vias appear in a contrasting color, i.e. dark grey or black. The contrasting colors permit feature extraction software and/or an engineer analyst to readily discriminate between the barrier layer material for the metal lines and the barrier material lining cavities previously occupied by the metal vias.

Figure 1A:
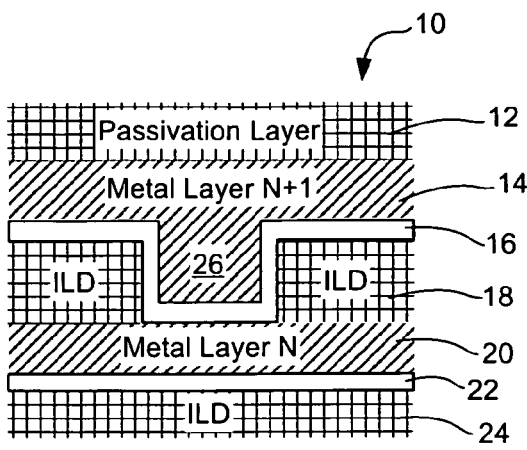
FIGS. 1a-1d are schematic diagrams illustrating a technique for preparing an integrated circuit die for imaging in accordance with the prior art.
Figure 1B:
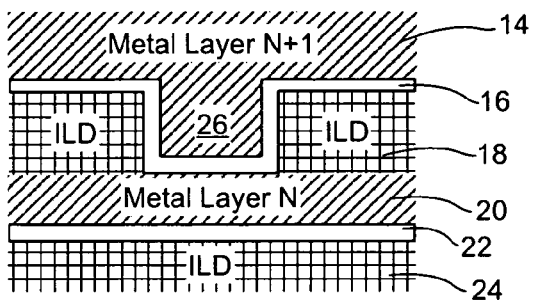
Figure 1C:
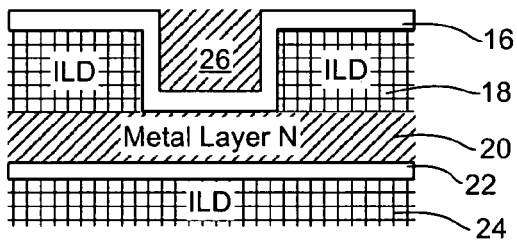
Figure 1D:
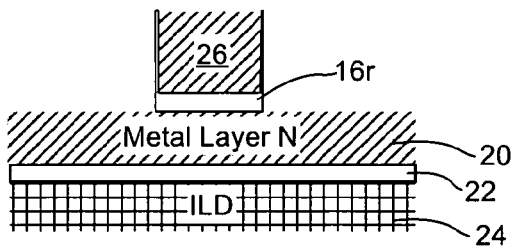
Figure 2:
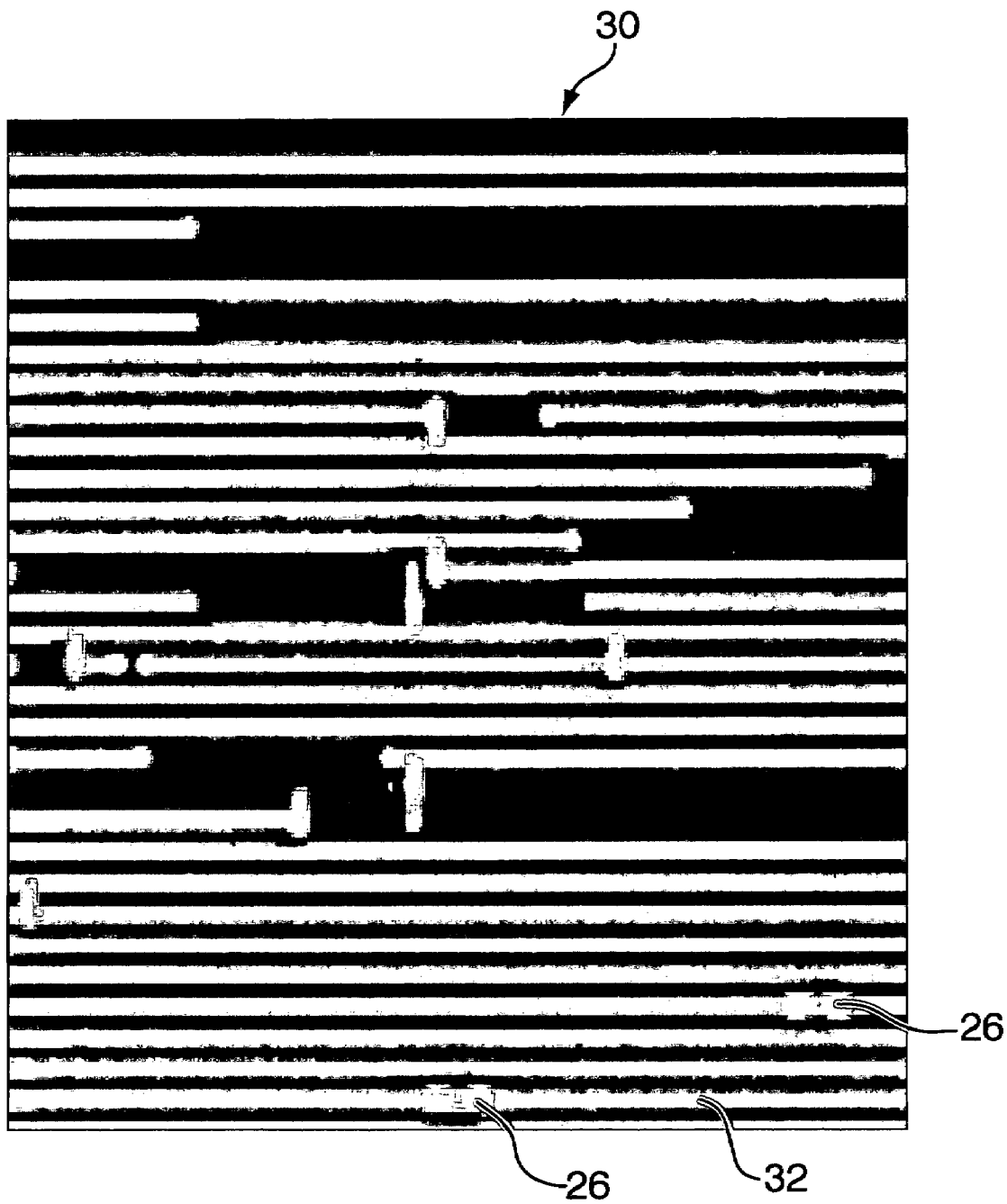
FIG. 2 is a reproduction of an image of a copper damascene integrated circuit prepared using the method shown in FIGS. 1a-1d.
Figure 3:
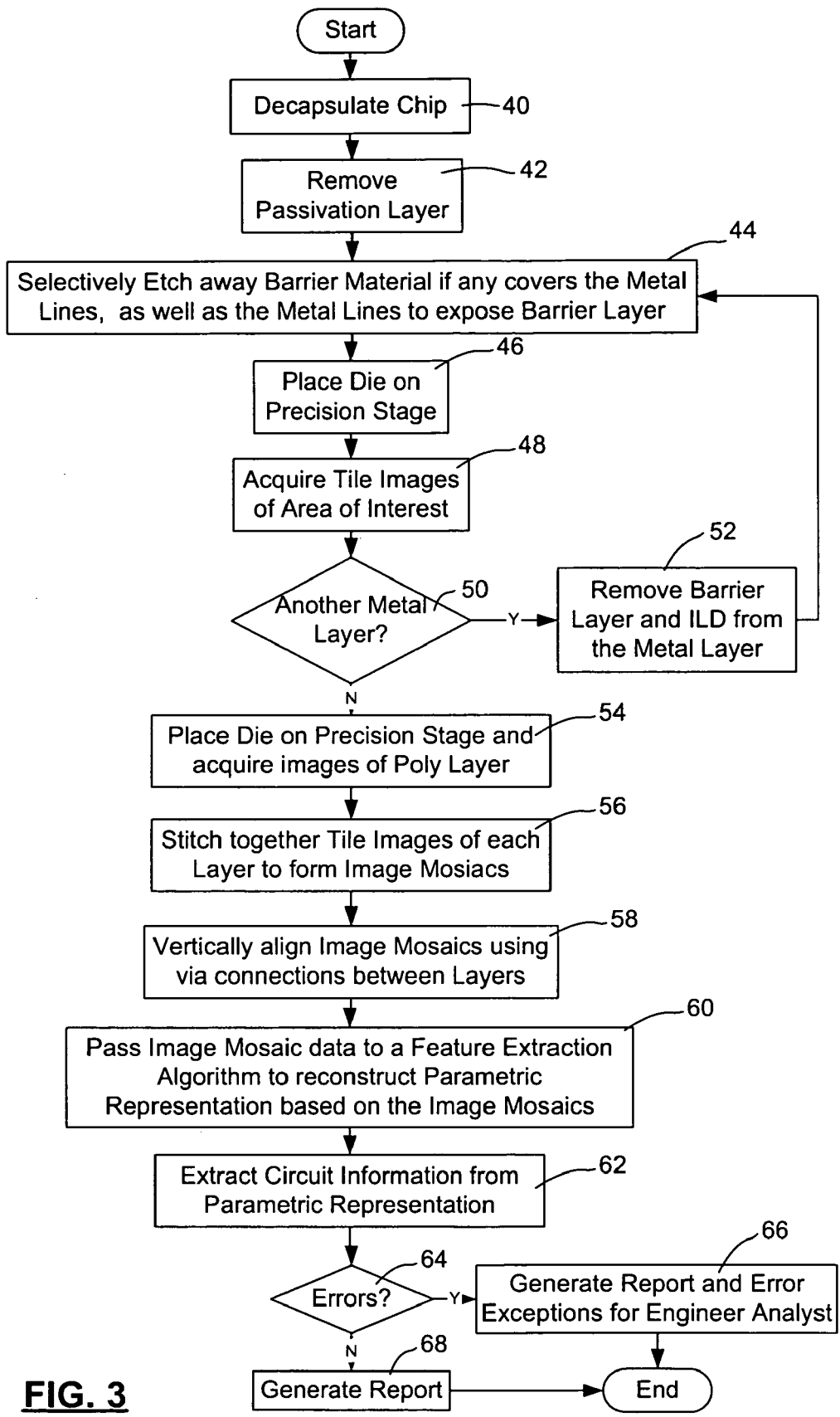
FIG. 3 is a flow chart providing a high level overview of methods for preparing an integrated circuit die for imaging in accordance with the invention.

FIG. 3 is a flow chart providing a high level overview of the methods in accordance with the invention. As is well understood in the art, before an integrated circuit die can be imaged it must be de-capsulated from a package (step 40). After the integrated circuit die is de-capsulated, a passivation layer 42 covering the first metal layer (metal layer N+1) is removed (step 42), as shown in FIG. 4b. The passivation layer may be removed using an etching process well known in the art.

The integrated circuit is then subjected to a wet or dry etching process to etch away metal lines 14 and vias 26 in order to expose an underlying barrier layer 16 (step 44). After the metal lines 14 and vias 26 are etched away (see FIG. 4c), the chip is placed on a precision stage (step 46) and tile images (step 48) are acquired of any area of interest. It is then determined (step 50) whether another metal layer of the integrated circuit exits. If so, an interlayer dielectric (ILD) 18 and any barrier material (not shown) that covers the metal lines is also removed. As is understood by those skilled in the art, a barrier layer is always applied under metal lines but the barrier layer is not always applied over the metal lines. Nonetheless, any process used to remove a passivation layer or an ILD will also remove any barrier material covering metal lines, while leaving the metal lines and any barrier material underlying them. When all material has been removed from that metal layer 20 (step 52), the process branches back to step 44.

After all metal layers have been exposed, etched away and imaged, any remaining interlayer dielectric is removed and the die is once again placed on the precision stage and images are acquired of a polycrystalline layer on which circuit components are formed (step 54). The tile images for each layer are stitched together in a manner well known in the art (step 56) to form image mosaics. The image mosaics are then vertically aligned, typically using via connections between layers to ensure correct inter-mosaic alignment (step 58). The aligned image mosaics are then passed to a feature extraction algorithm to reconstruct a parametric representation of the circuit die based on the aligned mosaic images (step 60). Circuit information is then extracted from the parametric representation (step 62), and it is determined whether logical errors exist in the circuit information (step 64). If so, a report with error exceptions is generated. The report including the error exceptions is passed to engineer analysts who must study the image mosaics and correct any missing or incorrect connections based on information retrieved from the mosaic images. If no errors were detected a report without error exceptions is generated (step 68) and the process ends.

Figure 4A:
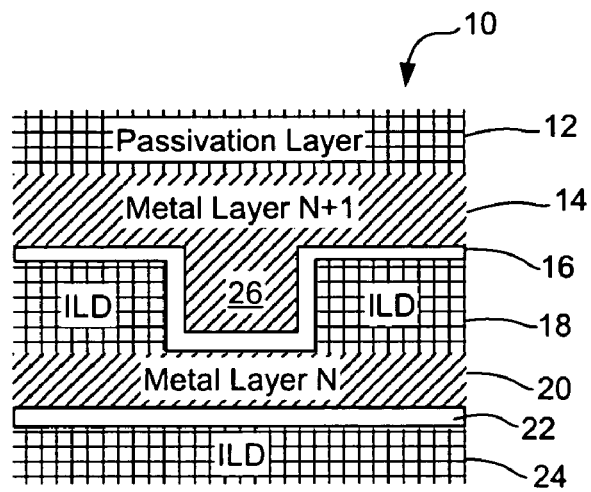
FIGS. 4a-4d are schematic diagrams illustrating a process for preparing an integrated circuit die for imaging in accordance with the invention.
Figure 4B:
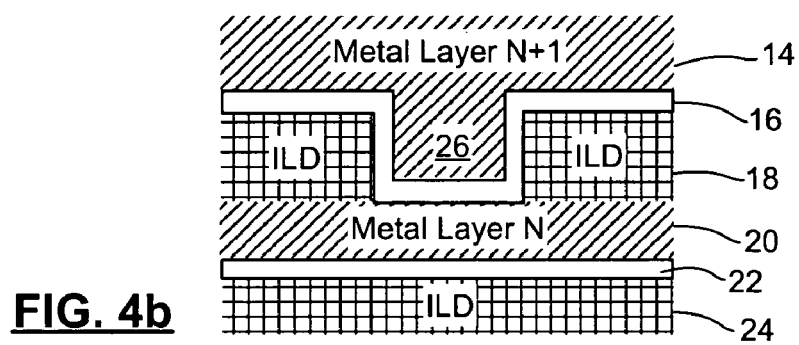
Figure 4C:
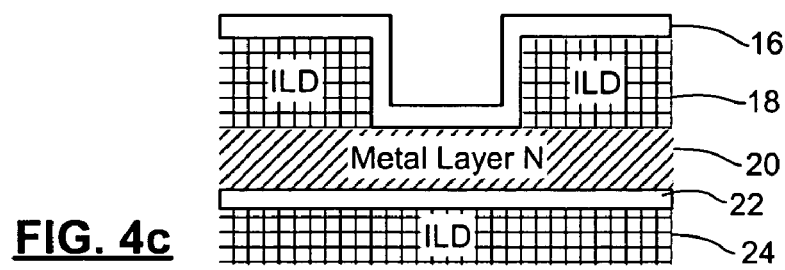

FIGS. 4a-4c illustrate the process described above with reference to FIG. 3 for an integrated circuit constructed using a copper damascene process. The integrated circuit 10 shown in FIG. 4a includes an passivation layer 12 that covers metal lines 14 of metal layer N+1. A via 26 interconnects the metal line 14 with the metal line 20 in the metal layer N. A barrier layer 16 segregates the metal line 14 from interlayer dielectric material 18. Barrier layer 16 is conductive and provides a connection between via 26 and metal line 20 of metal layer N. A barrier layer 22 separates metal line 20 from the interlayer dielectric 24 to ensure that no metal migrates into the interlayer dielectric, which would change its properties. As explained above, a barrier material (not shown) is applied over metal lines in some integrated circuit manufacturing processes.

FIG. 4b shows the integrated circuit die 10 after the passivation layer material 12 has been removed from the metal lines 14 of metal layer N+1. A wet or dry etching process is then used to etch away the metal lines 14 and the vias 26 leaving the barrier layer 16 shown in FIG. 4c. The integrated circuit shown in FIG. 4c is then ready for imaging.

As will be appreciated by those skilled in the art, the methods in accordance with the invention produce images in which vias 26 are shown in conjunction with the metal lines 14 to which they are connected at a top end, which is opposite to the methods used in the prior art. The process can therefore by described as a "top down" process. As will further be appreciated by those skilled in the art, layout extraction algorithms may require adjustment to ensure proper layout extraction using mosaic images acquired using integrated circuit die preparation methods in accordance with the invention.

Figure 5:
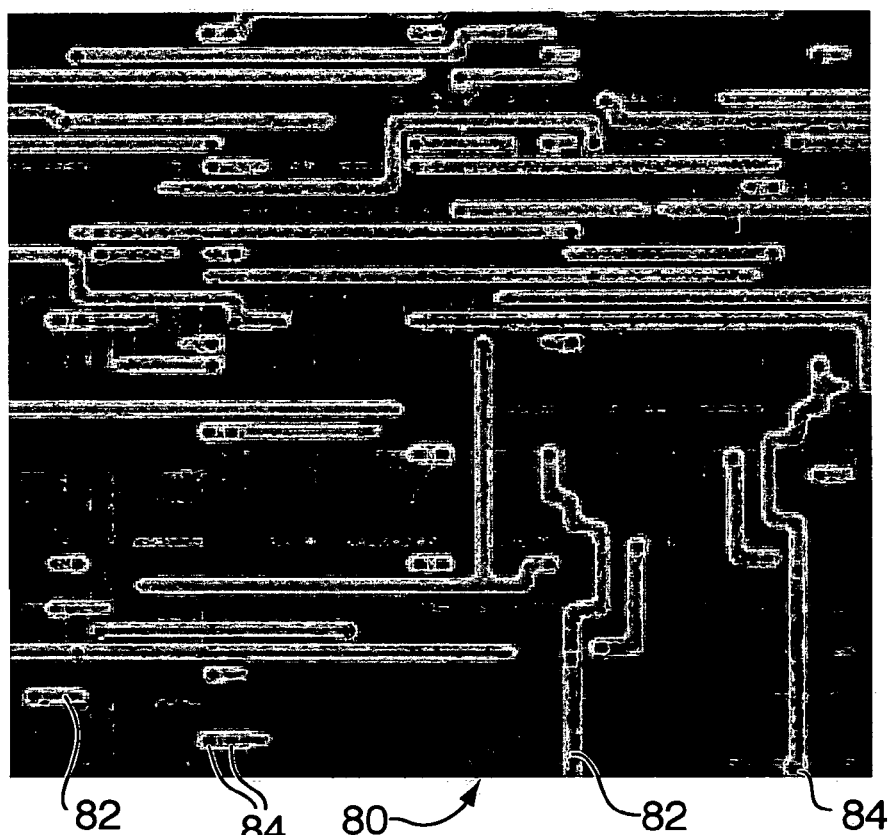
FIG. 5 is a reproduction of an image of an integrated circuit prepared in accordance with a process illustrated in FIGS. 4a-4c.

FIG. 5 is a reproduction of an image of a copper/copper integrated circuit prepared for imaging using the process shown in FIGS. 4a-4c. The image 80 is a scanning electron microscope image of an area of interest of the integrated circuit die. The barrier layers 82 that underlaid metal lines of the integrated circuit are light grey. The barrier layers that underlaid the vias 84 are dark grey or black, and are easily distinguishable from the barrier layers that underlaid the etched-away metal lines. The vias are also well defined and there is no ambiguity about the metal line with which each via is associated. Since the barrier layers that underlaid the vias are easily distinguished from the barrier layers that underlaid the metal lines, automated layout extraction is very efficient and completes with an extremely low error rate.

Figure 4D:
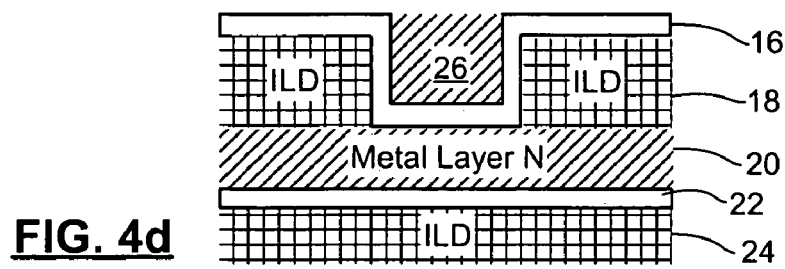

FIG. 4d shows the integrated circuit 10 prepared in accordance with the invention when the integrated circuit is constructed using aluminum lines 14 and tungsten vias 26. When that is the case, the etching processes shown in FIGS. 4a and 4b removes the aluminum lines but leaves the tungsten vias 26, as shown in FIG. 4d.

Figure 6:
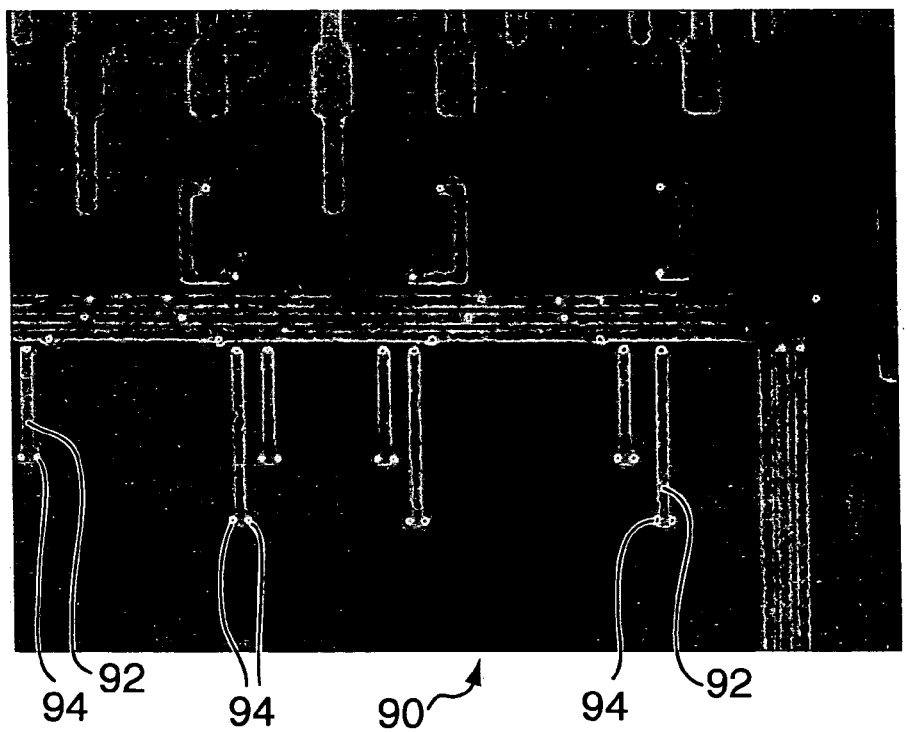
FIG. 6 is a reproduction of an image of an integrated circuit prepared in accordance with a process illustrated in FIGS. 4a, 4b and 4d.

FIG. 6 is a reproduction of an image of an area of interest of an integrated circuit constructed with aluminum lines and tungsten vias prepared for imaging in accordance with the invention. The image 90 was acquired using a scanning electron microscope. The barrier layers 92 appear as light grey lines while the tungsten vias 94 appear as bright white spots. Once again, feature extractions software is readily able to distinguish between background, the barrier layers 92 and the vias 94. Feature extractions is therefore facilitated and automated layout extraction errors are significantly reduced.

The invention therefore provides a less time consuming, simpler and more efficient method of preparing an integrated circuit die for imaging. The process provides images with better contrast and is particularly well adapted to use with integrated circuits manufactured using a copper damascene process, although it provides excellent results when used with any known integrated circuit construction.

The embodiments of the invention described above are intended to be exemplary only. The scope of the invention is therefore intended to be limited solely by the scope of the appended claims.

We claim:

1. A method of imaging an integrated circuit die, comprising:
    removing all material covering a metal layer of the integrated circuit die to expose the metal layer;
    removing all metal from metal lines of the metal layer while preserving a barrier layer that underlies each metal line; and
    acquiring tile images of the barrier layer within an area of interest of the integrated circuit die;
    wherein removing all metal from the metal lines further comprises removing all metal from vias descending downwards from the metal layer while preserving a barrier layer that surrounds each of the vias.

2. The method as claimed in claim 1 wherein removing all material covering the metal layer comprises etching away a passivation layer or an interlayer dielectric material using a dry etching process.

3. The method as claimed in claim 1 wherein removing all material from the metal layer comprises etching away a passivation layer or an interlayer dielectric material using a wet etching process.

4. The method as claimed in claim 1 wherein removing all material covering the metal layer comprises removing a passivation layer or an interlayer dielectric material using a chemical or mechanical polishing process.

5. The method as claimed in claim 1 wherein removing all metal from the metal lines comprises etching away the metal lines using a wet or a dry etching process.

6. The method as claimed in claim 1 wherein acquiring tile images comprises acquiring the tile images using a scanning electron microscope.

7. The method as claimed in claim 1 further comprising stitching together the tile images to form an image mosaic of the exposed barrier layer.

8. The method as claimed in claim 7 further comprising vertically aligning image mosaics of a plurality of exposed layers to form a three-dimensional model of the integrated circuit.

9. The method as claimed in claim 8 further comprising extracting features of the integrated circuit to reconstruct a parametric representation based on the aligned mosaic images.

10. The method as claimed in claim 9 further comprising extracting circuit information from the parametric representation.

11. The method as claimed in claim 10 further comprising preparing a report based on the circuit information.

12. A method for extracting circuit information from an integrated circuit die, comprising:
    for each metal layer of the integrated circuit die:
        removing all material covering the metal layer;
        removing metal lines from the metal layer to expose a barrier layer underlying each metal line;
        placing the integrated circuit die on a precision stage and acquiring tile images of the barrier layer in an area of interest of the integrated circuit die; and
    removing an interlayer dielectric material covering a polycrystalline silicon layer of the integrated circuit die, placing the integrated circuit die on the precision stage and acquiring tile images of the polycrystalline silicon layer;
    wherein removing metal lines from the metal layer further comprises removing metal from vias descending downwards from the metal layer to expose a barrier layer surrounding each of the vias.

* * * * *